US008829944B1

(12) United States Patent  
Miller

(10) Patent No.: US 8,829,944 B1  
(45) Date of Patent: Sep. 9, 2014

(54) DYNAMIC POWER SUPPLY SWITCHING FOR CLOCKING SIGNALS

(71) Applicant: Lattice Semiconductor Corporation, Hillsboro, OR (US)

(72) Inventor: Edward E. Miller, Beaverton, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 14/040,955

(22) Filed: Sep. 30, 2013

(51) Int. Cl.  
*H03K 17/00* (2006.01)

(52) U.S. Cl.  
USPC .............................. 327/99; 327/427; 327/434

(58) Field of Classification Search  
USPC .......................................... 327/99, 427, 434  
See application file for complete search history.

(56) References Cited

U.S. PATENT DOCUMENTS

| 4,754,160 | A | 6/1988 | Ely |
| 5,319,601 | A | 6/1994 | Kawata et al. |
| 5,801,586 | A | 9/1998 | Ishizuka |
| 6,522,190 | B1 | 2/2003 | Malik et al. |
| 7,334,152 | B2 * | 2/2008 | Morigaki ...................... 713/503 |
| 7,370,214 | B2 * | 5/2008 | Sheng et al. .................. 713/300 |
| 7,432,748 | B2 | 10/2008 | Khan et al. |
| 2012/0226929 | A1 | 9/2012 | Lee |

* cited by examiner

Primary Examiner — Kenneth B. Wells

(57) ABSTRACT

In an integrated circuit having input circuitry whose positive and/or negative input signals are gated by one or more clocked input switches, the switch clock signal CLK_SW used to clock the input switch(es) is automatically generated based on the higher of the IC's power supply voltage VDD and the positive input signal voltage Vplus. In one embodiment, a clock level shifter shifts an input clock signal CLK_VDD from the VDD voltage domain to generate a level-shifted clock signal CLK_VPLUS in the Vplus voltage domain. Based on a control signal VSEL, a clock selector selects either the input clock signal or the level-shifted clock signal to be the switch clock signal. An over-voltage detector generates both the logic state and the voltage domain of the control signal based on the higher of VDD and Vplus, such that the input switches are appropriately clocked even during over-voltage conditions in which Vplus>VDD.

11 Claims, 9 Drawing Sheets

DYNAMIC POWER SUPPLY SWITCHING FOR CLOCKING SIGNALS

BACKGROUND

1. Field

The present disclosure relates to electronic circuitry and, more specifically but not exclusively, to operating circuitry during over-voltage conditions.

2. Description of the Related Art

This section introduces aspects that may help facilitate a better understanding of the disclosure. Accordingly, the statements of this section are to be read in this light and are not to be understood as admissions about what is prior art or what is not prior art.

FIG. 1 is a simplified block diagram of a portion of a prior-art integrated circuit (IC) 100. As shown in FIG. 1, integrated circuit 100 provides two exemplary circuit functions: (i) analog signal processing implemented by an analog amplifier 104 and a signal processing circuit 106 and (ii) analog signal measurement for out-of-range voltage detection that triggers an alarm implemented by comparator 108 and flip-flop 110, all of which are powered by a local (i.e., on-chip) power supply consisting of a positive power supply voltage VDD and a negative power supply voltage (i.e., ground reference voltage) GND. The two exemplary circuit functions are driven by a differential analog input signal consisting of a positive input signal Vplus and a negative input signal Vminus that are applied to two IC input nodes, which can also be respectively referred to by the labels Vplus and Vminus. Application of the input signals Vplus and Vminus, as well as a reference signal Vtrip, to the two exemplary circuit functions is controlled by a set of clock-driven switches 102 driven by clock signal CLK. In other words, the two exemplary circuit functions are gated by the clocked switches 102. The rest of the details of these two exemplary circuit functions are not important for the present disclosure.

In many applications, the voltage levels of the input signals Vplus and Vminus stay within the supply voltage range for the IC. That is, the positive input signal voltage Vplus is always less than or equal to the positive supply voltage VDD, and the negative input signal voltage Vminus is always greater than or equal to the negative supply voltage GND. There are, however, applications that require handling voltages in excess of the IC supply voltage range. Handling voltages which exceed the IC supply voltage range usually require some special circuit techniques unless the signals can simply be divided down using a resistor divider to within the IC supply voltage range. Where dividers are not appropriate, e.g., when the input voltages can vary significantly and dynamically, such as from GND up to twice or more of the IC supply voltage VDD, circuit functions such as precision analog measurement present a challenge.

BRIEF DESCRIPTION OF THE DRAWINGS

Embodiments of the present invention are illustrated by way of example and are not limited by the accompanying figures, in which like references indicate similar or identical elements. Elements in the figures are illustrated for simplicity and clarity and have not necessarily been drawn to scale.

DETAILED DESCRIPTION

Figure 1:
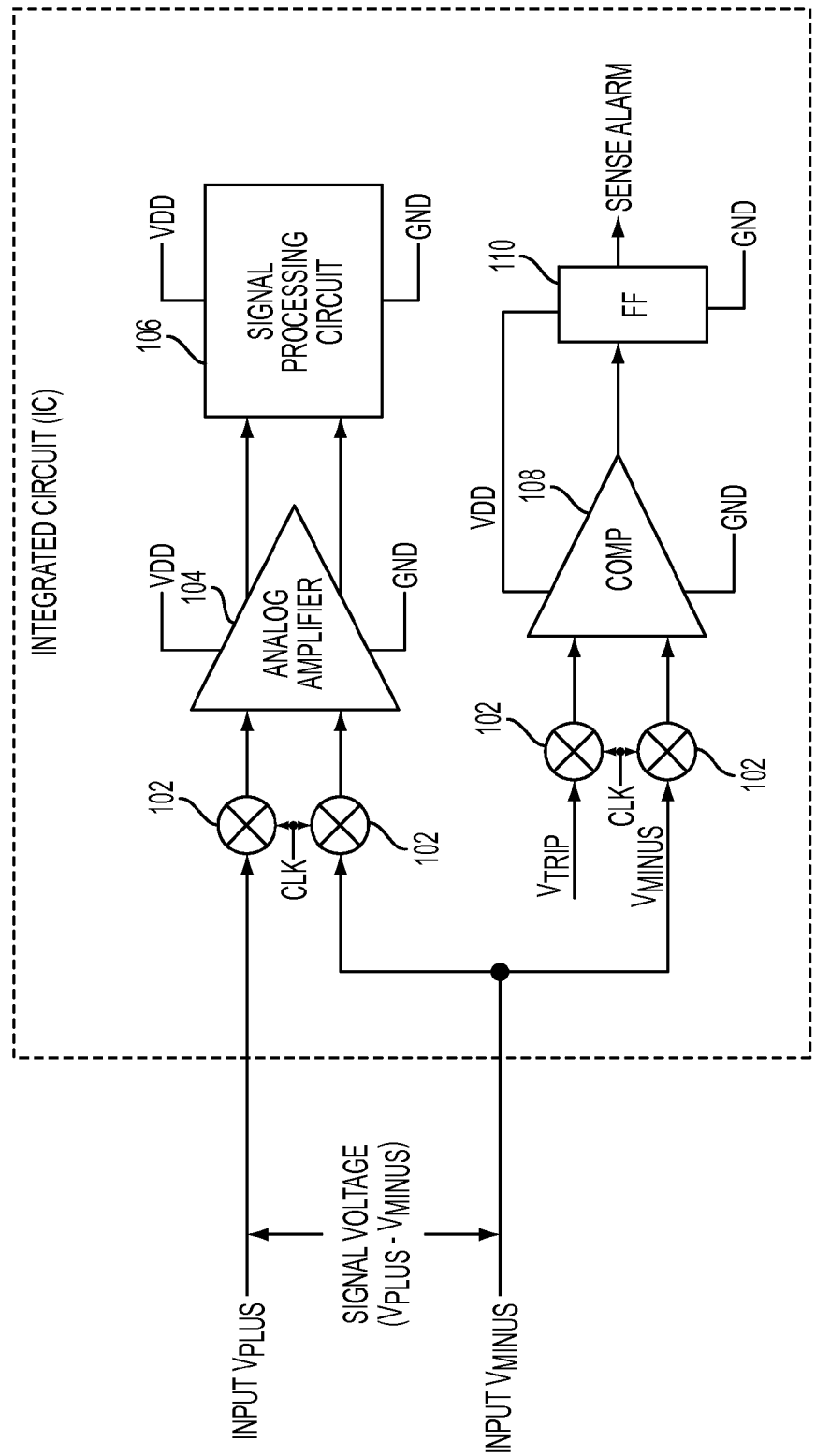
FIG. 1 is a simplified block diagram of a portion of a prior-art integrated circuit

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the invention.

One approach to handling signal voltages above the IC power supply is to use switched-capacitor (S-C) circuits where an input capacitor structure sustains the average voltage in order to (i) maintain the actual voltages applied at IC MOSFET gates in critical analog circuits, such as amplifiers and comparators, to within the desired voltage range for performance or (ii) prevent these devices from being overstressed by the high external voltage, or both. S-C circuits operate on clock signals or phases that turn on and turn off various switches in the circuit to perform analog circuit functions using well-known circuit techniques, such as those represented in FIG. 1. This requires the S-C clock voltage level to be equal to the highest input signal level in order to shut off PMOS transistors, which is never a problem for input voltages between VDD and GND.

However, internally generated clocks in the IC have a voltage swing limited by the supplies, i.e., GND to VDD. Where the input signal voltages can vary significantly, the S-C switches include both PMOS and NMOS transistors. PMOS switches are most efficient at voltages near VDD or at least well above GND, and NMOS switches are most efficient at voltages near GND or at least well below VDD, so the combination provides low-impedance conduction over the full voltage range. The clocks driving these transistors must apply a voltage range at the switches which will (i) enable low-impedance conduction when turned on and (ii) also turn off the switches completely when they are not to conduct. Level shifters can be used to translate signals from VDD to higher voltage levels if a low-impedance voltage source is available to power the level shifter, but they do not always work well over a wide voltage range. In particular, when the input signal is at a low voltage level, near GND for example, the level-shifted clock signals fail to provide the voltage needed for adequate switch conduction.

Switching between clock signals, one powered by VDD and another by a higher voltage equal to or greater than Vplus (it can be Vplus if the signal is low impedance) can solve this problem, but the switchover can create timing anomalies if any clock edges occur during a switchover between clock sources. This can result in clock-transition delays which may degrade performance. The embodiments described below address all of these issues.

By minimizing the loading on the positive input signal Vplus, this signal can be used as an alternative supply voltage for clocking input MOSFET switches. Applying Vplus to only a minimal load allows the signal to be used as a voltage source without degradation of analog measurements where the input signal is of sufficiently low impedance. In alternative embodiments, if available, a second supply associated with the input signal can be used as the alternative supply voltage instead of Vplus itself. For example, the second supply could be an external power supply that powers the external circuitry that generates Vplus.

Figure 2:
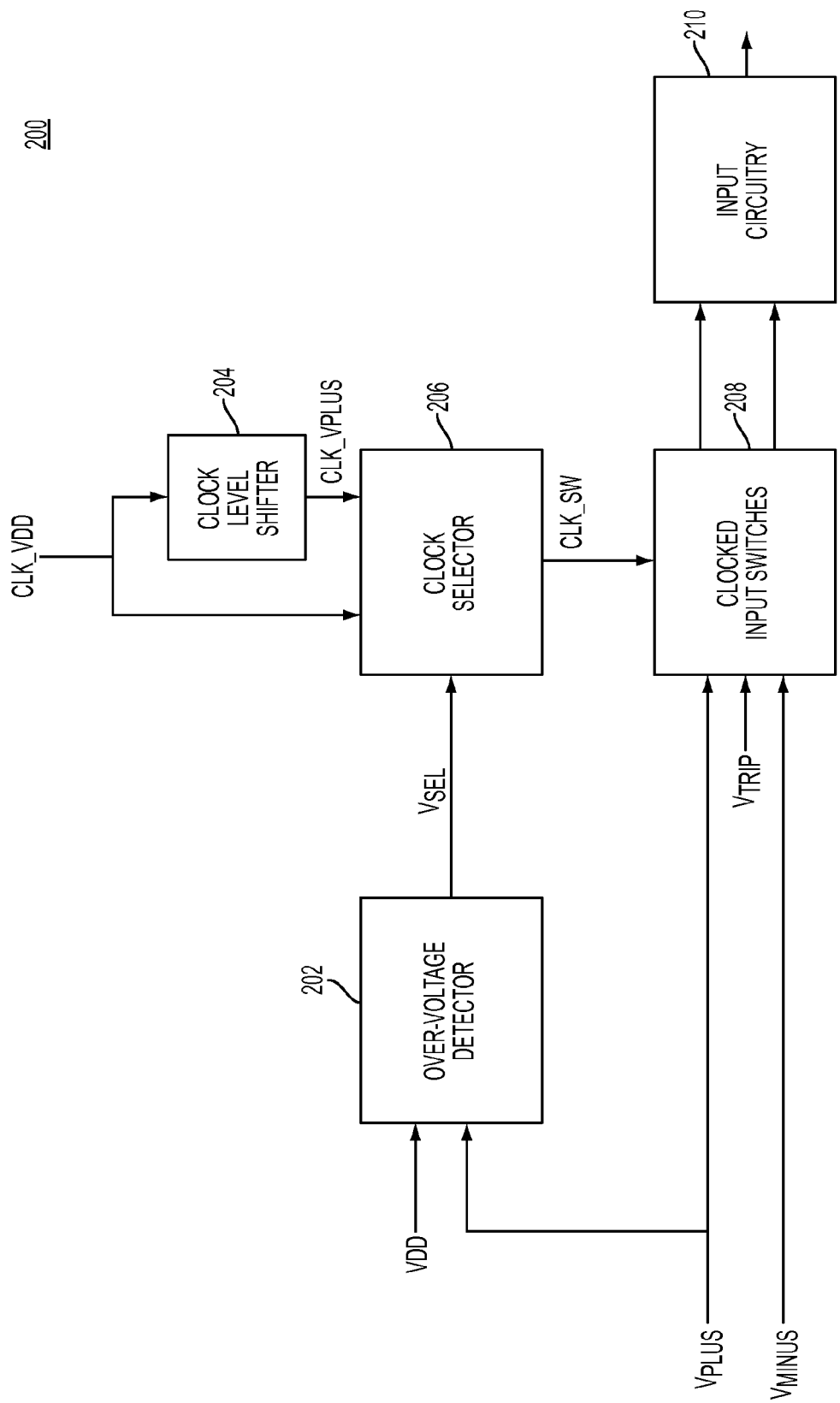
FIG. 2 is a simplified block diagram of a portion of an integrated circuit according to one embodiment of the present disclosure.

FIG. 2 is a simplified block diagram of a portion of an integrated circuit 200 according to one embodiment of the present disclosure. Analogous to integrated circuit 100 of FIG. 1, the application of input signals Vplus and Vminus (as well as reference signal Vtrip) to input circuitry 210 is gated by clocked input switches 208, which are driven by switch clock signal CLK_SW. When implemented using FET devices, input switches 208 have threshold voltages much greater than the error band for sensing a supply voltage switching event, which makes the switches transparent to MOSFET operation, even in the unlikely occurrence of supply switching during a clock phase transition.

Note that, although not always explicitly represented as such, the clock signals described in this specification are differential clock signals comprising a true clock phase and a complement clock phase.

Depending on the particular implementation, input circuitry 210 can perform analog signal processing and/or analog signal measurement analogous to the corresponding circuit functions in FIG. 1 and/or any other appropriate circuit functions.

Switch clock signal CLK_SW is provided to input switches 208 by clock selector 206, which selects switch clock signal CLK_SW to be either (i) input clock signal CLK_VDD or (ii) level-shifted clock signal CLK_VPLUS generated by clock level shifter 204, where the selection by clock selector 206 is based on a control signal VSEL generated by over-voltage detector 202.

Input clock signal CLK_VDD, which may be generated on-chip, is within the voltage domain of power supply VDD. Clock level shifter 204 level shifts input clock signal CLK_VDD from the VDD voltage domain to the voltage domain of the positive input signal Vplus to generate level-shifted clock signal CLK_VPLUS. Both clock signals are applied to clock selector 206. Clock level shifter 204 is designed to switch the clock phase supply voltage directly at the driver stages to drive FET switches 208 without glitching that can otherwise upset proper sampling operation. Since the supply source selection is integrated into the driving stage, PMOS switch turn on and NMOS switch turn off are completely independent of supply switching transients. In addition, since, at the point of supply switching, the two supplies are at or very near the same voltage, switching anomalies that may be present in other designs are eliminated.

In one implementation, clock level shifter 204, designed to implement the switching directly at the output stage, works efficiently whenever the voltage difference is more than 10 mV. The importance of switching directly at the output stage is that (1) switching delays are eliminated, which could otherwise allow for signal glitches that behave as runt clock signals, and (2) neither dead time (when neither drive path is enabled) nor driver contention (when both paths are enabled) are possible.

Over-voltage detector 202 compares the positive power supply voltage VDD to the positive input signal voltage Vplus to generate control signal VSEL. In one implementation, when over-voltage detector 202 detects that Vplus is less than VDD, over-voltage detector 202 drives control signal VSEL low to indicate that a normal operating condition exists. When over-voltage detector 202 detects that Vplus is greater than VDD, over-voltage detector 202 drives control signal VSEL high to indicate that an over-voltage condition exists. Note that, in addition to generating the logic state of the control signal VSEL based on the higher of VDD and Vplus, over-voltage generator 202 also sets the voltage domain of the control signal VSEL based on the higher of VDD and Vplus.

In one implementation, over-voltage detector 202 responds to supply differences of less than 10 mV for a 6-sigma offset error window to assure that the higher supply is active at the clock buffers. This voltage is well below the voltage required for conduction in input switches 208, so, during the switching of supplies, no MOS switches are allowed to conduct improperly.

Hysteresis in over-voltage detector 202 eliminates continual chatter at the sense output when the two supplies are equal or nearly equal with noise. This hysteresis results from a low-current design that results in a slow response for nearly identical supply source inputs, but a fast response for large voltage differences, so that continual chatter is eliminated.

When control signal VSEL is low (i.e., normal operating condition), clock selector 206 selects the input clock signal CLK_VDD to be the switch clock signal CLK_SW used to drive input switches 208. When control signal VSEL is high (i.e., over-voltage condition), clock selector 206 selects the level-shifted clock signal CLK_VPLUS to be the switch clock signal CLK_SW used to drive input switches 208.

Figure 3:
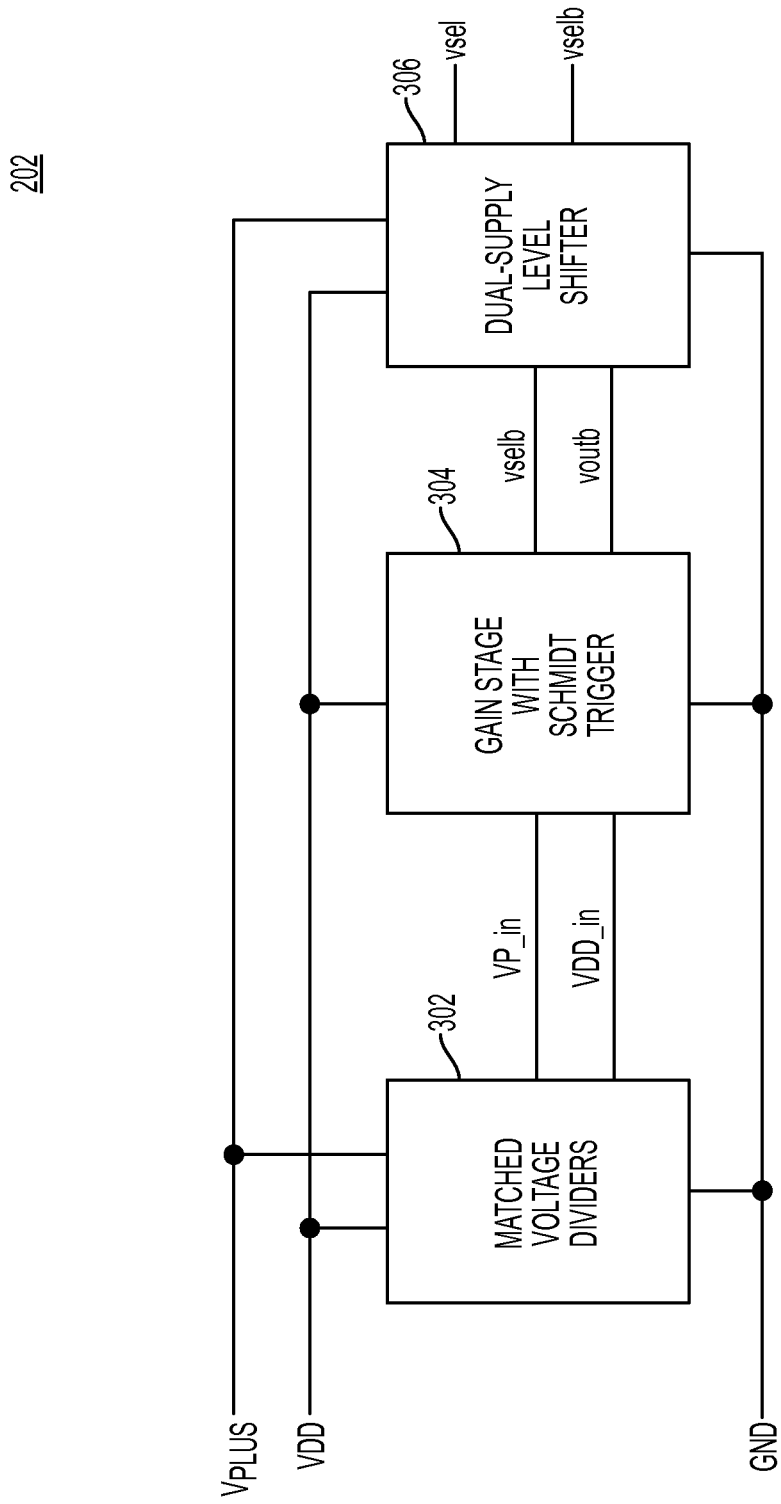
FIG. 3 is a simplified block diagram of one possible implementation of the over-voltage detector of FIG. 2.

FIG. 3 is a simplified block diagram of one possible implementation of over-voltage detector 202 of FIG. 2. A pair of matched voltage dividers 302 divide both the power supply voltage VDD and the positive input voltage Vplus by the same divisor to generate divided voltage signals VDD_in and VP_in, respectively.

Gain-stage circuitry 304, which includes a Schmidt trigger, generates the logic states of VDD-voltage-domain intermediate signals vselb and voutb based on the divided signals VDD_in and VP_in. In particular, when VDD_in is greater than VP_in (i.e., normal operating condition), gain-stage circuitry 304 drives signal vselb high (i.e., VDD) and signal voutb low (i.e., ground). When VP_in is greater than VDD_in (i.e., over-voltage condition), gain-stage circuitry 304 drives signal vselb low (i.e., GND) and signal voutb high (i.e., VDD). Gain-stage circuitry 304 is designed with low offset error enhanced by some voltage gain due to FET body bias effects and with output hysteresis to eliminate continual chatter for essentially equal voltages. Note that the voltage domain of intermediate signals vselb and voutb is the VDD voltage domain.

Dual-supply level shifter 306 generates true and complementary (aka false) components vsel and vselb of the control signal VSEL bfrom the intermediate signals vselb and voutb received from gain-stage circuitry 304, where the voltage domain for the control signals vsel and vselb is based on the greater of the power supply voltage VDD and the positive input voltage Vplus. Thus, if VDD is greater than Vplus, then dual-supply level shifter 306 generates the control signals vsel and vselb in the VDD voltage domain. If Vplus is greater than VDD, then dual-supply level shifter 306 generates the control signals vsel and vselb in the Vplus voltage domain.

At the output of gain-stage circuitry 304, differential, dual-supply level shifter 306 provides both true and complementary control signals vsel and vselb for both clock buffer supply sources. The output design of the single differential level shifter 306 ensures that supply switching is completely and tightly synchronized for the supply being enabled and the supply being disabled, which guarantees that both cannot be enabled at the same time, even briefly, to eliminate supply switching current feedthrough between supplies.

Figure 4:
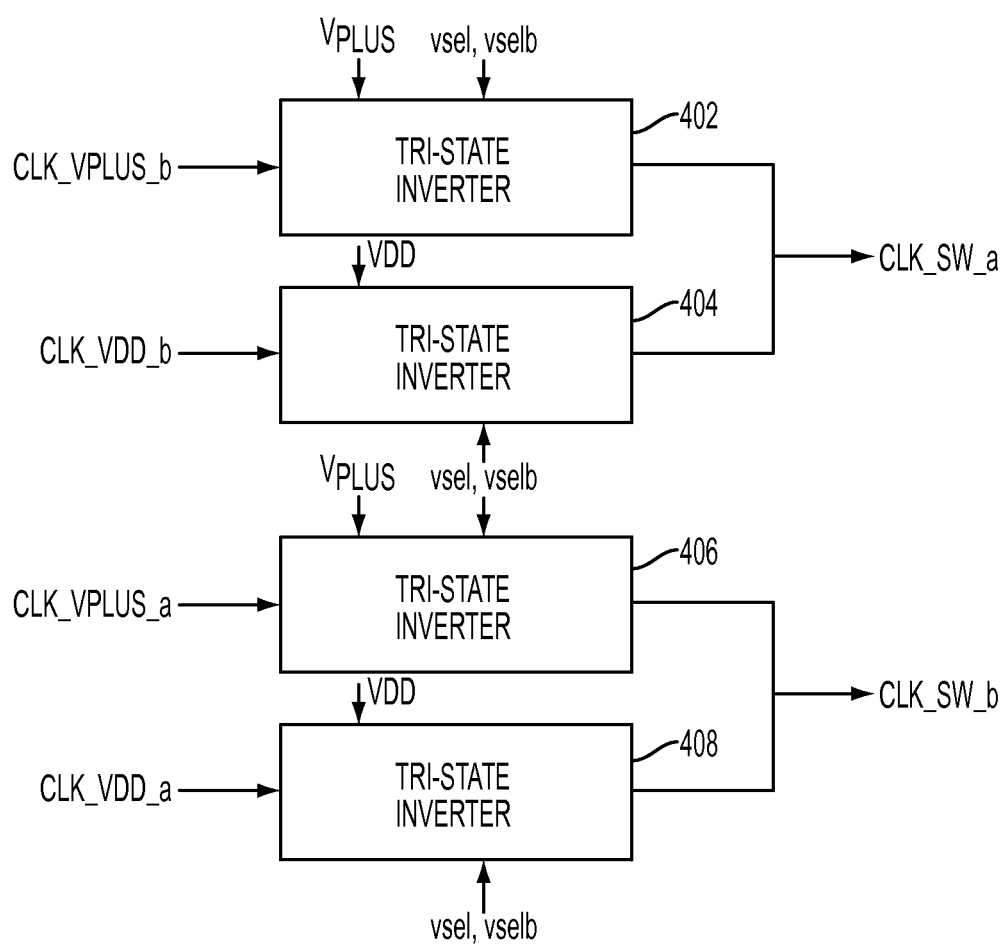
FIG. 4 is a simplified block diagram of one possible implementation of the clock selector of FIG. 2.

FIG. 4 is a simplified block diagram of one possible implementation of clock selector 206 of FIG. 2. Clock selector 206 has four tri-state inverters 402-408 configured to operate as output buffers. Tri-state inverters 402 and 404 respectively receive the inverted phases of level-shifted clock signal CLK_VPLUS (i.e., CLK_VPLUS_b) and input clock signal CLK_VDD (i.e., CLK_VDD_b) and together generate the non-inverted phase of switch clock signal CLK_SW (i.e., CLK_SW_a). Similarly, tri-state inverters 406 and 408 respectively receive the non-inverted phases of level-shifted clock signal CLK_VPLUS (i.e., CLK_VPLUS_a) and input clock signal CLK_VDD (i.e., CLK_VDD_a) and together generate the inverted phase of switch clock signal CLK_SW (i.e., CLK_SW_b).

As indicated in FIG. 4, tri-state inverters 402 and 406 are powered by the positive input signal Vplus, while tri-state inverters 404 and 408 are powered by the power supply voltage VDD. The control signals vsel and vselb are applied to all four tri-state inverters.

When vsel is low and vselb is high (indicating a normal operating condition), tri-state inverters 402 and 406 are tri-stated (i.e., disabled), and tri-state inverters 404 and 408 operate to generate both phases of switch clock signal CLK_SW in the VDD voltage domain based on input clock signal CLK_VDD. When vsel is high and vselb is low (indicating an over-voltage condition), tri-state inverters 404 and 408 are tri-stated, and tri-state inverters 402 and 406 operate to generate both phases of switch clock signal CLK_SW in the Vplus voltage domain based on level-shifted clock signal CLK_VPLUS.

Figure 5:
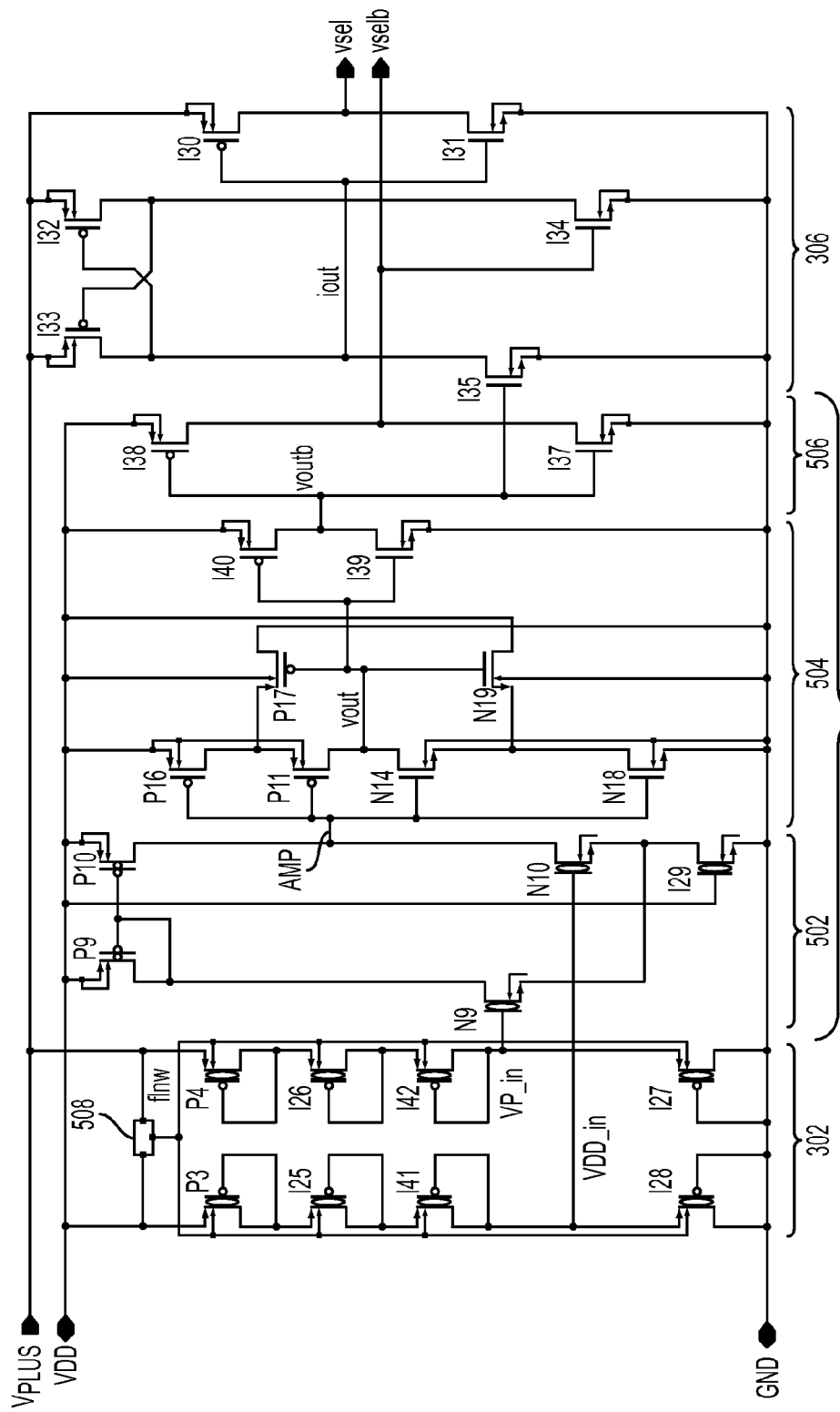
FIG. 5 is a schematic circuit diagram of one possible implementation of the over-voltage detector of FIG. 2.
Figure 7:
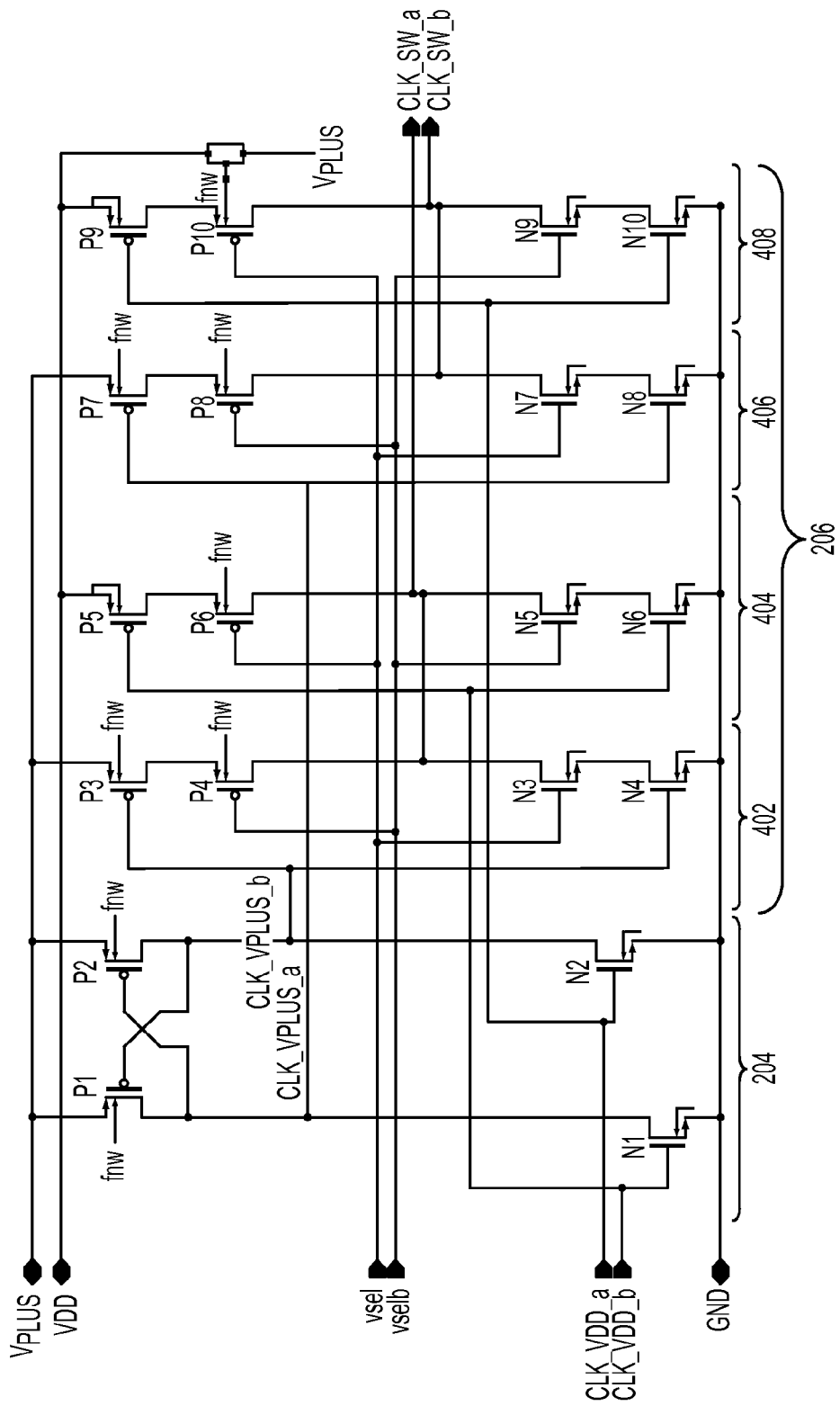
FIG. 7 is a schematic circuit diagram of one possible implementation of the clock level shifter of FIG. 2.
Figure 8:
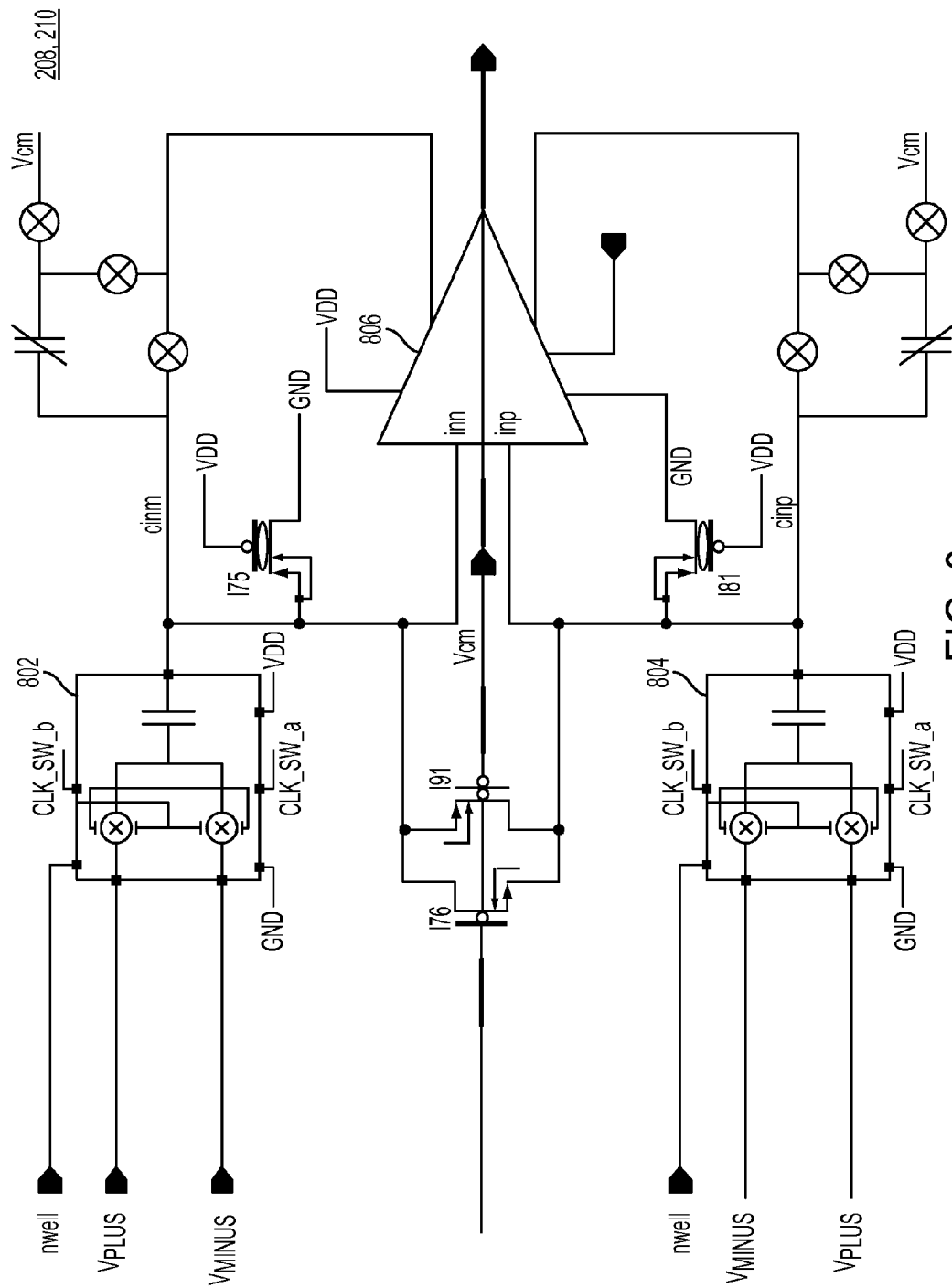
FIG. 8 is a schematic circuit diagram of one possible implementation of the input switches and the input circuitry of FIG. 2.

FIGS. 5, 7, and 8 are schematic circuit diagrams corresponding to one possible implementation of the different components of integrated circuit 200 shown in FIG. 2. In particular, FIG. 5 is a schematic circuit diagram of over-voltage detector 202, FIG. 7 is a schematic circuit diagram of clock level shifter 204 and clock selector 206, and FIG. 8 is a schematic circuit diagram of input switches 208 and input circuitry 210.

Referring to FIG. 5, transistors P3, I25, I41, and I28 form the voltage divider of matched voltage dividers 302 of FIG. 3 that generates the divided voltage signal VDD_in from the power supply voltage VDD, while transistors P4, I26, I42, and I27 form the other voltage divider of matched voltage dividers 302 that generates the divided voltage signal VP_in from the positive input signal Vplus.

Block 508 of FIG. 5 is a common bulk (e.g., n-well) bias voltage generator that generates a bulk bias voltage flnw that (i) is equal to the higher of VDD and Vplus and (ii) is applied to the bulk of each of the eight transistors in the pair of matched voltage dividers 302. Because all eight transistors share a common bulk bias voltage, they can all be implemented physically closer to each other in the integrated circuit layout, thereby improving the similarity of the divisors applied by the two matched voltage dividers.

This shared n-well structure provides a secondary advantage: Setting the bulk bias voltage flnw at the higher of the two supplies will back-bias or pinch the current flow in the divider string tied to the lower supply. This effect reduces the input to the gain-stage circuitry 304 at the lower supply sensed. The effect is to enhance the differential voltage sensed by differential pair N9/N10 and provide some measure of noise immunity from internal coupling into sensitive device nodes to reduce the potential for erroneous switching in high-noise environments.

Figure 6:
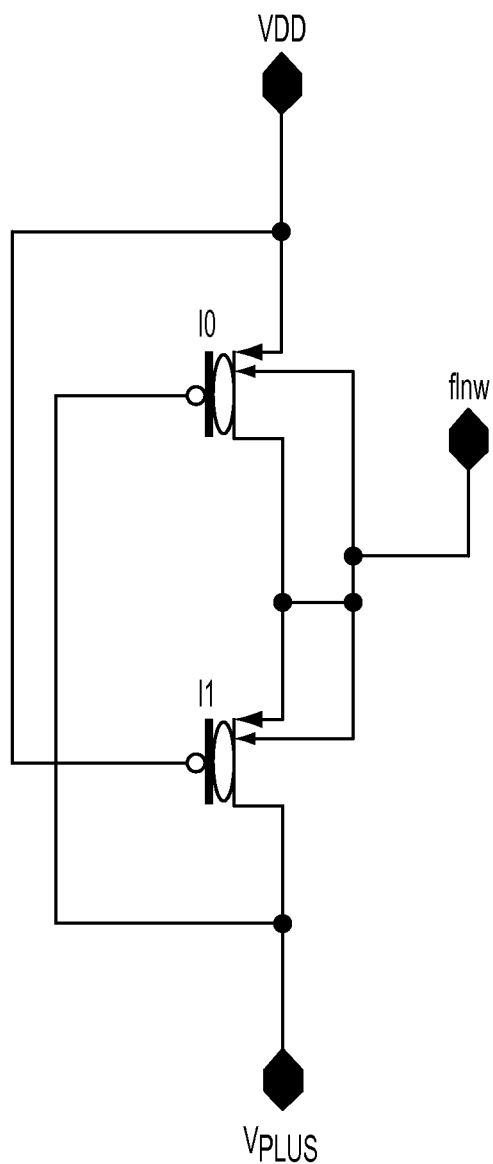
FIG. 6 is a schematic circuit diagram of the common bulk bias generator of FIG. 5.

FIG. 6 is a schematic circuit diagram of common bulk bias generator 508 of FIG. 5, which includes a pair of low-threshold PMOS devices I0 and I1, cross-connected to pass the higher of the two applied voltages VDD and Vplus. When power supply voltage VDD is greater than positive input signal voltage Vplus, transistor I0 is on and transistor I1 is off, which drives bulk bias voltage flnw to VDD. When positive input signal voltage Vplus is greater than power supply voltage VDD, transistor I0 is off and transistor I1 is on, which drives bulk bias voltage flnw to Vplus. Note that the bulk bias voltage flnw is also applied to the bulks of transistors I0 and I1.

Transistors P9, P10, N9, N10, and I29 form a voltage gain stage 502 of gain-stage circuitry 304 of FIG. 3, while transistors P16, P17, P11, N14, N19, and N18 and inverter transistors I39 and I40 form Schmidt trigger 504 of gain-stage circuitry 304, which outputs VDD-voltage-domain intermediate signal voutb. Schmidt trigger 504 is a standard Schmidt trigger implementation, but with a large hysteresis. The large hysteresis enables dynamic switching as the monitored voltage varies, while eliminating "chatter" (output oscillations due to noise differential between the device supply voltage VDD and the monitored voltage Vplus).

When the power supply voltage VDD is greater than the input voltage Vplus, then the divided voltage VDD_in is greater than the divided voltage VP_in. In this case, the drain current of device N10 is greater than the drain current of device N9. The N9 drain current equals the P9 drain current, which gets mirrored as the P10 drain current, which is therefore less than the N10 drain current. As a result, node "amp" is pulled toward GND. When the node "amp" voltage drops sufficiently, currents in devices N18 and N14 are reduced, and the node "vout" begins to move up from GND. As soon as the gate-source voltage across device N19 is sufficient to conduct current, device N14 loses current equal to that taken by device N19, which drives node "vout" even higher in a positive feedback mechanism which results in device N19 taking all of the N18 current to ensure that the "vout" node rises to VDD. PMOS transistors P16 and P11 conduct current to pull "vout" to VDD. This is the well-known Schmidt Trigger mechanism.

If the input voltage Vplus rises to greater than the supply voltage VDD, then the N9 drain current becomes greater than the N10 drain current. The N9 drain current is mirrored so that the P10 drain current exceeds the N10 drain current, and node "amp" rises to VDD. When the node "amp" voltage rises sufficiently, the gate-source voltages across devices P11 and P16 are reduced, and device N14 begins to conduct current. When the node "amp" voltage rises further, the N14 drain current pulls node "vout" below VDD, and eventually device P17 begins to conduct, thus starving device P11 of current, and the Schmidt Trigger positive feedback works in the opposite direction as before. As device P17 starves device P11 and "vout" falls towards GND, the N19 gate-source voltage drops so that eventually all of the N18 current passes through device N14 to pull node "vout" to GND.

Gain-stage circuitry 304 also includes transistors I37 and I38, which form an inverter 506 that outputs VDD-voltagedomain intermediate signal vselb. Inverter 506 provides switching speed that insures that the control signals vsel and vselb switch simultaneously.

Transistors I35, I33, I32, I34, I30, and I31 form dual-supply level shifter 306 of FIG. 3, which converts the VDD-voltage-domain intermediate signals voutb and vselb into true and complementary control signals vsel and vselb. Dual-supply level shifter 306 is a single differential buffer, half biased on the supply voltage VDD and half biased on the monitored supply Vplus. The side of the differential buffer which is in a logical high state switches supply depending on which supply is greater. The high-state logic is explained in two cases.

In the first case of an over-voltage condition, the monitored supply voltage Vplus is greater than the IC supply voltage VDD. In that case, the control signal vsel is driven to the monitored supply voltage Vplus, which provides the correct logical high state for the active supply, while the complementary control signal vselb is driven to the negative supply voltage GND, which is common to both supplies.

In the second case of a normal operating condition, the IC supply VDD greater than the monitored supply Vplus. In that case, the control signal vsel is driven to GND, while complementary control signal vselb is driven to the IC supply voltage VDD, which provides the logical high state for the active supply.

Note that, when VDD is greater than Vplus, gain-stage circuitry 304 drives intermediate signal vselb to VDD, which is also the appropriate voltage level for the complementary control signal vselb. When Vplus is greater than VDD, gain-stage circuitry 304 drives intermediate signal vselb to GND, which is also the appropriate voltage level for the complementary control signal vselb, since GND is the negative voltage level for both the VDD voltage domain and the Vplus voltage domain. That is why the intermediate signal vselb can be passed through dual-supply level shifter 306 without ever going through any level shifting (during both normal operating conditions and over-voltage conditions) to be presented as the complementary control signal vselb.

Referring to FIG. 7, transistors P1, P2, N1, and N2 form clock level shifter 204 of FIG. 2, which generates Vplus-voltage-domain, level-shifted clock signal CLK_VPLUS from VDD-voltage-domain, input clock signal CLK_VDD. Input clock phases CLK_VDD_a and CLK_VDD_b (biased by positive supply VDD and negative supply GND) drive clock level shifter 204 with the sources of transistors P1 and P2 connected to the monitored supply voltage Vplus.

Input clock phases CLK_VDD_a and CLK_VDD_b form a differential signal pair. When CLK_VDD_a rises and CLK_VDD-b falls, device N2 conducts current, and device N1 is shut off. Device N2 pulls the signal node CLK_VPLUS_b to GND, which pulls the gate of device P1 low, so that device P1 conducts to pull signal node CLK_VPLUS_a to the voltage at Vplus. Conversely, when the input clocks switch state, the signal node CLK_VPLUS_b is driven to the voltage at Vplus, and the signal node CLK_VPLUS_b is driven to GND.

When the input signal Vplus is a very small voltage, such as 200 mV, the gate-source voltages applied to the appropriate PMOS device, P1 or P2, might not be sufficient to enable current conduction. It is important to recognize that this apparent failure is not an issue, because the input voltage Vplus will not be the selected voltage, because the select circuit of FIG. E will have node vsel driven to GND and vselb driven to VDD, so the selected clock signal is CLK_VDD, and the voltages at nodes CLK_VPLUS_a and CLK_VPLUS_b are deselected.

The rest of FIG. 7 corresponds to clock selector 206 of FIG. 2, which comprises the four tri-state inverters 402-408 of FIG. 4. Input clock CLK_VDD drives tri-state inverters 404 and 408, biased from the IC supply voltage VDD, while level-shifted clock signal CLK_VPLUS generated by clock level shifter 204 drives tri-state inverters 402 and 406, biased from the monitored supply voltage Vplus.

In particular, transistors P3, P4, N3, and N4 form tri-state inverter 402 of FIG. 4, which generates the non-inverted phase CLK_SW_a of switch clock CLK_SW from the inverted phase CLK_VPLUS_b of the level-shifted clock signal CLK_VPLUS during over-voltage conditions. Transistors P5, P6, N5, and N6 form tri-state inverter 404 of FIG. 4, which generates the non-inverted phase CLK_SW_a of switch clock CLK_SW from the inverted phase CLK_VDD_b of the input clock signal CLK_VDD during normal operating conditions.

Transistors P7, P8, N7, and N8 form tri-state inverter 406 of FIG. 4, which generates the inverted phase CLK_SW_b of switch clock CLK_SW from the non-inverted phase CLK_VPLUS_a of the level-shifted clock signal CLK_VPLUS during over-voltage conditions. Transistors P9, P10, N9, and N10 form tri-state inverter 408 of FIG. 4, which generates the inverted phase CLK_SW_b of switch clock CLK_SW from the non-inverted phase CLK_VDD_a of the input clock signal CLK_VDD during normal operating conditions.

Tri-state inverters 402 and 404 have a common output node CLK_SW_a, while tri-state inverters 406 and 408 have their own common output node CLK_SW_b. PMOS devices P4, P6, P8, and P10 are placed in a common n-well controlled by bulk bias voltage generator I30 with the common n-well node fnw, biased at the higher of the two voltages VDD and Vplus, which enables complete shutoff of the inactive buffer devices. Depending on the implementation, bulk bias voltage generator I30 may be a second instance of the bulk bias voltage generator of FIG. 6 or the same instance may be used to generate both bulk bias voltage flnw of FIG. 5 and bulk bias voltage fnw of FIG. 7. Note that flnw and fnw are both abbreviations for "floating n-well," because the n-well voltages will float to the higher of the two voltage sources applied.

When the IC supply voltage VDD is greater than the monitored voltage Vplus, the voltage at node fnw is the IC supply voltage VDD, and the control signals vsel and vselb are GND and VDD, respectively. Therefore, devices P4 and P8 have their gate voltages equal to their bulk (n-well) voltage, with neither source nor drain capable of a higher voltage, so they are disabled. Devices P6 and P10 have their gate voltages tied to GND, or zero volts, so they are enabled. In a similar manner, devices N5 and N9 have their gate voltages at VDD and are enabled, so tri-state inverters 404 and 408 biased by supply VDD are active. Devices N3 and N7 have their gate voltages at GDN, so they are disabled.

When the input signal voltage Vplus is greater than the IC supply voltage VDD, the voltage at node fnw is at the input signal voltage Vplus, and the control signals vsel and vselb are Vplus and GND, respectively. Now, devices P4 and P8 have their gate voltages tied to GND, so they are enabled. Devices P6 and P10 have their gate voltages tied to Vplus, which is also their bulk (n-well) voltage, so they are disabled. In a similar manner, devices N5 and N9 have their gates tied to GND and are disabled, while devices N3 and N7 have gate voltages at Vplus, so they are active.

When supply VDD and supply Vplus are equal, the hysteresis in Schmidt trigger 504 of FIG. 5 ensures that the control signals vsel and vselb are at valid logic states and not intermediate voltages. Noise and other factors may result in occasional switching of states at nodes vsel and vselb, but, except for the sub-nanosecond switching time, the control signals vsel and vselb are always in valid logic states of either '0' or '1', where '0' is GND, and '1' is the selected higher voltage of supply voltage VDD and supply voltage Vplus.

When the supplies are equal, then it does not matter which tri-state inverters conduct and which tri-state inverters are disabled, because the output signal being driven high is being driven to the same voltage from either side. The output signals being driven low are not affected by any switchover so PMOS switch enable and NMOS switch disable are not impacted.

Figure 9:
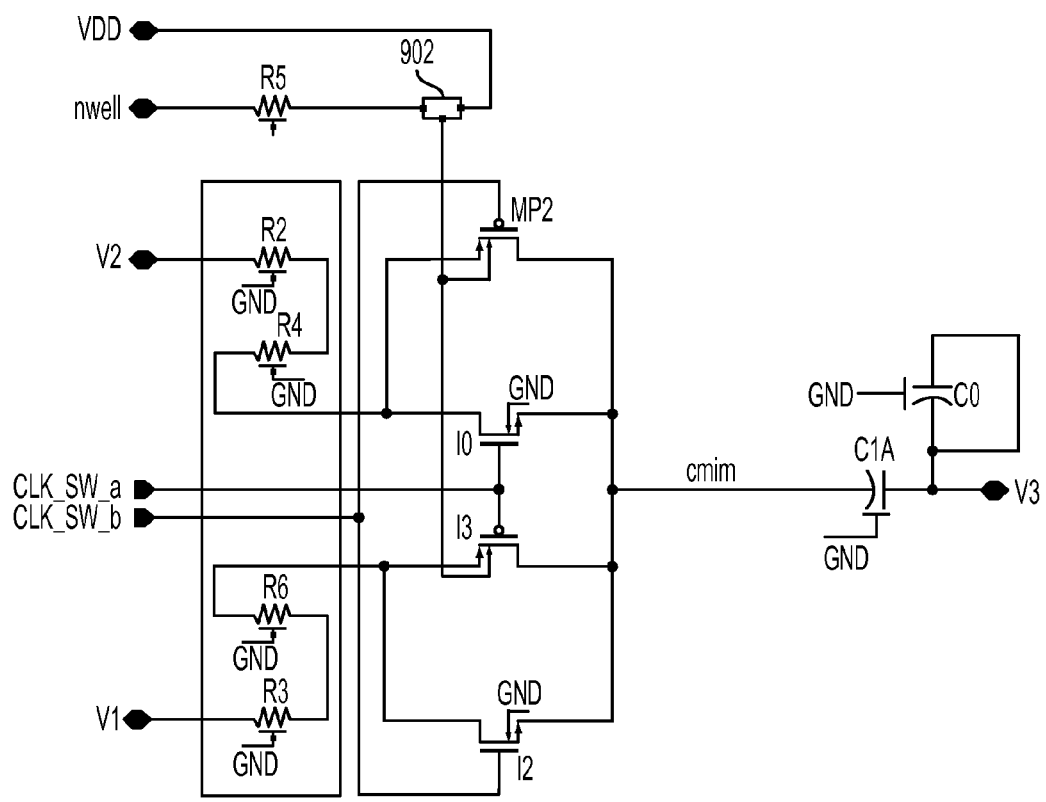
FIG. 9 is a schematic circuit diagram of switch circuitry that can be used to implement each of the switch blocks of FIG. 8.

FIG. 8 is an exemplary circuit implementation of clocked input switches 208 and input circuitry 210 of FIG. 2 for an amplifier analogous to analog amplifier 104 of FIG. 1 with corresponding input switches 102. In particular, switch blocks 802 and 804 form clocked input switches 208 of FIG. 2, which are analogous to input switches 102 of FIG. 1. Details of these blocks, which are switched-capacitor input switches plus storage capacitors, are shown in FIG. 9. The rest of the elements shown in FIG. 8, including amplifier 806, form an exemplary embodiment of input circuitry 210 of FIG. 2 that is analogous to analog amplifier 104 of FIG. 1.

Switch block 802 receives input signals $V_{PLUS}$ and $V_{MINUS}$ and outputs switched input signal cinm, which gets applied to the negative input inn of amplifier 806, while switch block 804 receives input signals $V_{PLUS}$ and $V_{MINUS}$ and outputs switched input signal cinp, which gets applied to the positive input inp of amplifier 806. Note that cinm and cinp are complementary signals due to the fact that the input signals $V_{PLUS}$ and $V_{MINUS}$ are flipped for switch block 804 relative to switch block 802. The timing of both switch blocks 802 and 804 is based on switch clock phases CLK_SW_a and CLK_SW_b. nwell is an n-well bias voltage for switch blocks 802 and 804, while Vcm is the common-mode voltage midway between $V_{PLUS}$ and $V_{MINUS}$.

Amplifier 806 and its feedback capacitor networks contain all the critical timing and charge transfer timing requirements for accuracy. An input sub-circuit, formed by devices I76 and I91, samples the switched input signals cinm and cinp, but the timing is delayed such that the sub-circuit's transitions do not overlap the amplifier's critical timing, so that no charge errors occur.

Implementing an input switched-capacitor circuit running on clocks that switch supplies and using the input capacitors to isolate the remaining circuits from supply changes enables the monitoring functions to do all critical timing functions on the IC supply voltage, with only input signal sampling done with the input switching MOSFETs and input capacitance structure. The rest of the details of exemplary input circuitry 210 shown in FIG. 8 are not important for the present disclosure.

FIG. 9 is a schematic circuit diagram of switch circuitry 900, which can be used to implement each of switch blocks 802 and 804 of FIG. 8. Inputs CLK_SW_a and CLK_SW_b are the clock signals that control input switch pairs MP2/I0 and I2/I3. When CLK_SW_a is high and CLK_SW_b is low, the input v2 is selected to apply a voltage at node cmim of the storage capacitor CIA. When the clock signals reverse state, input v1 is selected to apply a voltage at node cmim. When switch circuitry 900 is used to implement switch block 802 of FIG. 8, inputs v1 and v2 are input signals $V_{MINUS}$ and $V_{PLUS}$, respectively, and output v3 is switched input signal cinm. On the other hand, when switch circuitry 900 is used to implement switch block 804 of FIG. 8, inputs v1 and v2 are input signals $V_{PLUS}$ and $V_{MINUS}$, respectively, and output v3 is switched input signal cinp. Bias generator 902 generates the n-well bias voltage for devices MP2 and I3 in a manner analogous to bias generator 508 of FIG. 6.

Although the disclosure has been described in the context of a specific switched-capacitor implementation, the invention is not so limited. In general, the invention can be used with any circuit architecture in which input switches are used, including, for example, chopper-stabilized amplifiers designed to handle inputs above the IC supply voltage or communications links between devices either at different power supplies or with common-mode noise which potentially results in input voltages exceeding the IC supply voltage.

The disclosure can be applied to switched-capacitor circuit designs that perform current-monitoring functions that are directly tied to the IC inputs. Switched-capacitor inputs are used to protect sensitive internal amplifiers from voltages exceeding the IC supply voltage. The input switches of these circuits operate at the monitored voltage in order to control the PMOS switches when the monitored voltage exceeds the IC supply voltage.

The present disclosure enables analog measurement and signal processing of a small signal with a dynamically changing common-mode voltage range from zero volts (GND) to voltages well in excess of the power supply (VDD) of the IC that performs these functions with one or more of the following capabilities:

(1) Accurate measurement of a low-level differential signal (in the 1-100 mV range) for an input common mode level anywhere from GND to greater than VDD, possibly even more than twice VDD.

(2) When the monitored input voltage is less than the IC power supply voltage, the input circuitry operates on the IC power supply to provide sufficient drive to operate the input switching MOSFETs or performance degrades to unacceptable levels.

(3) When the monitored input voltage is greater than the IC power supply voltage, the input circuitry operates on the monitored signal to control input switching MOSFETs, because the PMOS switch devices must have body connection to the highest voltage to avoid parasitic conduction from device source to well, which bypasses the device and may cause latchup.

(4) Monitored input is assumed to vary dynamically below and above the IC power supply, with no ability to control such common-mode behavior.

(5) Although clock supply switching can occur during normal operation at critical timing edges, the circuit functions properly and meets design specifications even if the supply switching occurs in the middle of clock transitions.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

Embodiments of the invention may be implemented as (analog, digital, or a hybrid of both analog and digital) circuit based processes, including possible implementation as a single integrated circuit (such as an ASIC or an FPGA), a multi chip module, a single card, or a multi card circuit pack. As would be apparent to one skilled in the art, various functions of circuit elements may also be implemented as processing blocks in a software program. Such software may be employed in, for example, a digital signal processor, micro controller, general purpose computer, or other processor.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Also, for purposes of this disclosure, it is understood that all gates are powered from a fixed voltage power domain (or domains) and ground unless shown otherwise. Accordingly, all digital signals generally have voltages that range from approximately ground potential to that of one of the power domains and transition (slew) quickly. However and unless stated otherwise, ground may be considered a power source having a voltage of approximately zero volts, and a power source having any desired voltage may be substituted for ground. Therefore, all gates may be powered by at least two power sources, with the attendant digital signals therefrom having voltages that range between the approximate voltages of the power sources.

Signals and corresponding nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "channel node" refers generically to either the source or drain of a metal oxide semiconductor (MOS) transistor device (also referred to as a MOSFET), and the term "control node" refers generically to the gate of the MOSFET. Similarly, as used in the claims, the terms "source," "drain," and "gate" should be understood to refer either to the source, drain, and gate of a MOSFET or to the emitter, collector, and base of a bi polar device when an embodiment of the invention is implemented using bi-polar transistor technology.

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain embodiments of this invention may be made by those skilled in the art without departing from embodiments of the invention encompassed by the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non enabled embodiments and embodiments that correspond to non statutory subject matter are explicitly disclaimed even if they fall within the scope of the claims.

What is claimed is:

1. An integrated circuit comprising:
   positive and negative input nodes configured to receive positive and negative input signals (e.g., Vplus, Vminus);
   input circuitry (e.g., 210) powered by a local power supply signal (e.g., VDD);
   a set of one or more clocked input switches (e.g., 208) connected between the input nodes and the input circuitry and configured to control application of the input signals to the input circuitry based on a switch clock signal (e.g., CLK_SW);
   clock circuitry (e.g., 204, 206) configured to selectively generate the switch clock signal based on either the local power supply signal or the positive input signal; and
   an over-voltage detector (e.g., 202) configured to detect whether the positive input signal is greater than or less than the local power supply signal and generate and apply a corresponding control signal (e.g., VSEL) to the clock circuitry, such that:
      when the control signal indicates that the positive input signal is greater than the local power supply signal, the clock circuitry uses the positive input signal to power the switch clock signal; and when the control signal indicates that the positive input signal is less than the local power supply signal, the clock circuitry uses the local power supply signal to power the switch clock signal.

2. The invention of claim 1, wherein the clock circuitry comprises:
a clock level shifter (e.g., 204) configured to level-shift an input clock signal (e.g., CLK_VDD) from a voltage domain of the local power supply to generate a level-shifted clock signal (e.g., CLK_VPLUS) in a voltage domain of the positive input signal; and
a clock selector (e.g., 206) configured to select either the input clock signal or the level-shifted clock signal to be the switch clock signal based on the control signal.

3. The invention of claim 2, wherein the clock selector comprises:
a first tri-state inverter (e.g., 402) configured to invert a first phase (e.g., CLK_VPLUS_b) of the level-shifted clock signal when the control signal indicates that the positive input signal is greater than the local power supply signal to generate a first phase (e.g., CLK_SW_a) of the switch clock signal;
a second tri-state inverter (e.g., 404) configured to invert a first phase (e.g., CLK_VDD_b) of the input clock signal when the control signal indicates that the positive input signal is less than the local power supply signal to generate the first phase of the switch clock signal;
a third tri-state inverter (e.g., 406) configured to invert a second phase (e.g., CLK_VPLUS_a) of the level-shifted clock signal when the control signal indicates that the positive input signal is greater than the local power supply signal to generate a second phase (e.g., CLK_SW_b) of the switch clock signal; and
a fourth tri-state inverter (e.g., 408) configured to invert a second phase (e.g., CLK_VDD_a) of the input clock signal when the control signal indicates that the positive input signal is less than the local power supply signal to generate the second phase of the switch clock signal.

4. The invention of claim 1, wherein the over-voltage detector comprises:
a pair of matched voltage dividers (e.g., 302) for the local power supply signal and the positive input signal configured to generate, respectively, a divided local power supply signal (e.g., VDD_in) and a divided positive input signal (e.g., VP_in);
gain-stage circuitry (e.g., 304) configured to generate intermediate signals (e.g., vselb and voutb) from the divided signals; and
a dual-supply level shifter (e.g., 306) configured to generate true and complementary components (e.g., vsel and vselb) of the control signal based on the intermediate signals.

5. The invention of claim 4, wherein a common bulk bias voltage (e.g., flnw) is configured to be applied to bulks of all transistor devices used to implement the pair of matched voltage dividers.

6. The invention of claim 5, further comprising a bulk bias voltage generator (e.g., 508) configured to generate the common bulk bias voltage to be the larger of the local power supply signal and the positive input signal.

7. The invention of claim 4, wherein the gain-stage circuitry comprises:
a gain stage (e.g., 502) configured to amplify the divided signals;
a Schmidt trigger (e.g., 504) configured to establish logic states for the intermediate signals based on the divided signals; and an output inverter (e.g., 506) configured to invert an output of the Schmidt trigger.

8. The invention of claim 4, wherein the dual-supply level shifter is configured to set a voltage domain for the true and complementary components of the control signal based on the larger of the local power supply signal and the positive input signal.

9. The invention of the 8, wherein the dual-supply level shifter converts a voltage domain of the intermediate signals to a voltage domain corresponding to the larger of the local power supply signal and the positive input signal.

10. The invention of claim 1, wherein:
the clock circuitry comprises:
a clock level shifter (e.g., 204) configured to level-shift an input clock signal (e.g., CLK_VDD) from a voltage domain of the local power supply to generate a level-shifted clock signal (e.g., CLK_VPLUS) in a voltage domain of the positive input signal; and
a clock selector (e.g., 206) configured to select either the input clock signal or the level-shifted clock signal to be the switch clock signal based on the control signal;
the clock selector comprises:
a first tri-state inverter (e.g., 402) configured to invert a first phase (e.g., CLK_VPLUS_b) of the level-shifted clock signal when the control signal indicates that the positive input signal is greater than the local power supply signal to generate a first phase (e.g., CLK_SW_a) of the switch clock signal;
a second tri-state inverter (e.g., 404) configured to invert a first phase (e.g., CLK_VDD_b) of the input clock signal when the control signal indicates that the positive input signal is less than the local power supply signal to generate the first phase of the switch clock signal;
a third tri-state inverter (e.g., 406) configured to invert a second phase (e.g., CLK_VPLUS_a) of the level-shifted clock signal when the control signal indicates that the positive input signal is greater than the local power supply signal to generate a second phase (e.g., CLK_SW_b) of the switch clock signal; and
a fourth tri-state inverter (e.g., 408) configured to invert a second phase (e.g., CLK_VDD_a) of the input clock signal when the control signal indicates that the positive input signal is less than the local power supply signal to generate the second phase of the switch clock signal;
the over-voltage detector comprises:
a pair of matched voltage dividers (e.g., 302) for the local power supply signal and the positive input signal configured to generate, respectively, a divided local power supply signal (e.g., VDD_in) and a divided positive input signal (e.g., VP_in);
a bulk bias voltage generator (e.g., 508) configured to generate a common bulk bias voltage (e.g., flnw) to be the larger of the local power supply signal and the positive input signal, wherein the common bulk bias voltage is configured to be applied to bulks of all transistor devices used to implement the pair of matched voltage dividers;
gain-stage circuitry (e.g., 304) configured to generate intermediate signals (e.g., vselb and voutb) from the divided signals, wherein the gain-stage circuitry comprises:
a gain stage (e.g., 502) configured to amplify the divided signals;
a Schmidt trigger (e.g., 504) configured to establish logic states for the intermediate signals based on the divided signals; and
an output inverter (e.g., 506) configured to invert an output of the Schmidt trigger; and a dual-supply level shifter (e.g., 306) configured to generate true and complementary components (e.g., vsel and vselb) of the control signal based on the intermediate signals, wherein:

the dual-supply level shifter is configured to set a voltage domain for the true and complementary components of the control signal based on the larger of the local power supply signal and the positive input signal; and the dual-supply level shifter converts a voltage domain of the intermediate signals to a voltage domain corresponding to the larger of the local power supply signal and the positive input signal.

11. A method for processing signals by an integrated circuit, the method comprising:

(a) receiving positive and negative input signals (e.g., Vplus, Vminus);

(b) controlling application of the input signals to input circuitry (e.g., 210) of the integrated circuit based on a switch clock signal (e.g., CLK_SW);

(c) selectively generating the switch clock signal based on either a local power supply signal (e.g., VDD) or the positive input signal; and (d) detecting whether the positive input signal is greater than or less than the local power supply signal and generating a corresponding control signal (e.g., VSEL), such that:

when the control signal indicates that the positive input signal is greater than the local power supply signal, the positive input signal is used to power the switch clock signal; and when the control signal indicates that the positive input signal is less than the local power supply signal, the local power supply signal is used to power the switch clock signal.

\* \* \* \* \*